United States Patent
Wang

(10) Patent No.: US 12,232,346 B2
(45) Date of Patent: Feb. 18, 2025

(54) QUANTUM DOT LIGHT-EMITTING DEVICE AND DRIVING METHOD THEREOF, AND DISPLAY SUBSTRATE

(71) Applicant: BOE Technology Group Co., Ltd., Beijing (CN)

(72) Inventor: Tieshi Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/770,153

(22) PCT Filed: Mar. 22, 2021

(86) PCT No.: PCT/CN2021/082156
§ 371 (c)(1),
(2) Date: Apr. 19, 2022

(87) PCT Pub. No.: WO2022/198405
PCT Pub. Date: Sep. 29, 2022

(65) Prior Publication Data
US 2024/0147747 A1     May 2, 2024

(51) Int. Cl.
*H10K 50/115*     (2023.01)
*H10K 50/13*     (2023.01)
*H10K 50/16*     (2023.01)

(52) U.S. Cl.
CPC .......... *H10K 50/115* (2023.02); *H10K 50/13* (2023.02); *H10K 50/166* (2023.02)

(58) Field of Classification Search
CPC .... H10K 50/115; H10K 50/13; H10K 50/166; H10K 59/32
See application file for complete search history.

(56) References Cited

U.S. PATENT DOCUMENTS

| | | | |
|---|---|---|---|
| 2013/0033199 A1* | 2/2013 | Ali | H10K 59/32 438/34 |
| 2013/0240847 A1* | 9/2013 | Zakhidov | H10K 71/00 977/842 |

(Continued)

FOREIGN PATENT DOCUMENTS

| | | |
|---|---|---|
| CN | 106611826 A | 5/2017 |
| CN | 107046103 A | 8/2017 |

(Continued)

OTHER PUBLICATIONS

Brazis, P., "Quantum Dots and Their Potential Impact on Lighting and Display Applications", Underwriters Laboratory, Jul. 2017. (Year: 2017).*

(Continued)

*Primary Examiner* — J. E. Schoenholtz
(74) *Attorney, Agent, or Firm* — ArentFox Schiff LLP; Michael Fainberg

(57) ABSTRACT

Disclosed are a quantum dot light-emitting device and a driving method thereof, and a display substrate. The quantum dot light-emitting device has a laminated structure, the laminated structure may be simplified into a quantum dot light-emitting device of one upright light-emitting structure and one inverted light-emitting structure, and the upright light-emitting structure and the inverted light-emitting structure are placed in a laminated mode through a layer of a common electrode.

17 Claims, 13 Drawing Sheets

(56) References Cited

U.S. PATENT DOCUMENTS

| | | |
|---|---|---|
| 2014/0014896 A1 | 1/2014 | Chung et al. |
| 2016/0093678 A1 | 3/2016 | Seo et al. |
| 2017/0229437 A1* | 8/2017 | Wehlus ................. H10K 50/14 |
| 2020/0328367 A1 | 10/2020 | Park et al. |
| 2021/0159467 A1 | 5/2021 | Wu et al. |
| 2024/0057422 A1* | 2/2024 | Yamazaki ............ H10K 59/121 |

FOREIGN PATENT DOCUMENTS

| | | | |
|---|---|---|---|
| CN | 110718638 A | | 1/2020 |
| CN | 111048674 A | | 4/2020 |
| CN | 111354856 A | | 6/2020 |
| CN | 111816778 A | | 10/2020 |
| CN | 111816782 A | * | 10/2020 |

OTHER PUBLICATIONS

Machine translation of CN 111816782 (Year: 2020).*
Song et al. "All-solution-processed colour-tuneable tandem quantum-dot light-emitting diode driven by AC signal", Royal Chemistry of Science, Aug. 5, 2020.
Liu et al., "Low Power Consumption Red Light-Emitting Diodes Based on Inorganic Perovskite Quantum Dots under an Alternating Current Driving Mode", Nanomaterials 2018, 8, 974, Nov. 26, 2018.

* cited by examiner

QUANTUM DOT LIGHT-EMITTING DEVICE AND DRIVING METHOD THEREOF, AND DISPLAY SUBSTRATE

CROSS-REFERENCE TO RELATED APPLICATIONS

This application is a National Stage of International Application No. PCT/CN2021/082156, filed Mar. 22, 2021, which is hereby incorporated by reference in its entirety.

FIELD

The present disclosure relates to the technical field of display, in particular to a quantum dot light-emitting device and a driving method thereof, and a display substrate.

BACKGROUND

Quantum dots are a kind of solution-processable semiconductor nanocrystals. Quantum dot light-emitting devices prepared by using them as light-emitting layers have the advantages of a high color gamut, self-luminescence, a fast response speed, and a low turn-on voltage, and are expected to become a display technology of a next generation.

SUMMARY

An embodiment of the present disclosure provides a quantum dot light-emitting device, including:
  a first electrode;
  a second electrode, arranged opposite to the first electrode;
  a common electrode, located between the first electrode and the second electrode;
  a first quantum dot light-emitting layer, located between the first electrode and the common electrode;
  a second quantum dot light-emitting layer, located between the second electrode and the common electrode;
  a first auxiliary functional layer, located between the first electrode and the first quantum dot light-emitting layer;
  a second auxiliary functional layer, located between the first quantum dot light-emitting layer and the common electrode;
  a third auxiliary functional layer, located between the second quantum dot light-emitting layer and the common electrode; and
  a fourth auxiliary functional layer, located between the second electrode and the second quantum dot light-emitting layer.

In one possible implementation, in the above quantum dot light-emitting device provided by embodiments of the present disclosure, the first electrode, the first auxiliary functional layer, the first quantum dot light-emitting layer, the second auxiliary functional layer and the common electrode which are sequentially arranged in a laminated mode constitute one of an upright light-emitting structure and an inverted light-emitting structure, and the common electrode, the third auxiliary functional layer, the second quantum dot light-emitting layer, the fourth auxiliary functional layer and the second electrode which are sequentially arranged in a laminated mode constitute the other one of the upright light-emitting structure and the inverted light-emitting structure.

In one possible implementation, in the above quantum dot light-emitting device provided by embodiments of the present disclosure, the first quantum dot light-emitting layer and the second quantum dot light-emitting layer include quantum dot materials in a same color.

In one possible implementation, in the above quantum dot light-emitting device provided by embodiments of the present disclosure, the first quantum dot light-emitting layer and the second quantum dot light-emitting layer include quantum dot materials in different colors.

In one possible implementation, in the above quantum dot light-emitting device provided by embodiments of the present disclosure, the second electrode is located on a light extraction side of the quantum dot light-emitting device, and a light-emitting wavelength of the first quantum dot light-emitting layer is larger than a light-emitting wavelength of the second quantum dot light-emitting layer.

In one possible implementation, in the above quantum dot light-emitting device provided by embodiments of the present disclosure, materials of two film layers in the second auxiliary functional layer and the third auxiliary functional layer in direct contact with the common electrode are different.

In one possible implementation, in the above quantum dot light-emitting device provided by embodiments of the present disclosure, the second auxiliary functional layer and the third auxiliary functional layer are both electron transport layers.

In one possible implementation, in the above quantum dot light-emitting device provided by embodiments of the present disclosure, the first auxiliary functional layer includes a hole injection layer in direct contact with the first electrode and a hole transport layer in direct contact with the first quantum dot light-emitting layer;
  the fourth auxiliary functional layer includes a hole injection layer in direct contact with the second electrode and a hole transport layer in direct contact with the second quantum dot light-emitting layer.

In one possible implementation, in the above quantum dot light-emitting device provided by embodiments of the present disclosure, the second auxiliary functional layer and the third auxiliary functional layer each includes a hole injection layer and a hole transport layer, and the hole injection layers are located between the common electrode and the hole transport layers.

In one possible implementation, in the above quantum dot light-emitting device provided by embodiments of the present disclosure, the first auxiliary functional layer and the fourth auxiliary functional layer each includes an electron transport layer.

In another aspect, an embodiment of the present disclosure further provides a display substrate, including: a plurality of the above quantum dot light-emitting devices provided by embodiment of the present disclosure.

In one possible implementation, in the above display substrate provided by embodiments of the present disclosure, a first quantum dot light-emitting layer and a second quantum dot light-emitting layer of each quantum dot light-emitting device include quantum dot materials in a same color.

In one possible implementation, in above display substrate provided by embodiments of the present disclosure, the display substrate has a plurality of pixels, and each pixel includes a first quantum dot light-emitting device, a second quantum dot light-emitting device and a third quantum dot light-emitting device which are arranged adjacent to one another;

the first quantum dot light-emitting layer and the second quantum dot light-emitting layer of each first quantum dot light-emitting device include red quantum dot materials;

the first quantum dot light-emitting layer and the second quantum dot light-emitting layer of each second quantum dot light-emitting device include green quantum dot materials;

the first quantum dot light-emitting layer and the second quantum dot light-emitting layer of each third quantum dot light-emitting device include blue quantum dot materials.

In one possible implementation, in the above display substrate provided by embodiments of the present disclosure, the display substrate has a plurality of pixels, each pixel includes a first quantum dot light-emitting device, a second quantum dot light-emitting device and a third quantum dot light-emitting device which are arranged adjacent to one another, and a first quantum dot light-emitting layer and a second quantum dot light-emitting layer of at least one of the first quantum dot light-emitting device, the second quantum dot light-emitting device or the third quantum dot light-emitting device include quantum dot materials of different colors.

In one possible implementation, in the above display substrate provided by embodiments of the present disclosure, in each second quantum dot light-emitting device and each third quantum dot light-emitting device adjacent to each other, the two corresponding first quantum dot light-emitting layers and the two corresponding second quantum dot light-emitting layers include quantum dot materials in three different colors in total.

In one possible implementation, in the above display substrate provided by embodiments of the present disclosure, the first quantum dot light-emitting layer of the first quantum dot light-emitting device includes red quantum dot materials, and the second quantum dot light-emitting layer of the first quantum dot light-emitting device includes green quantum dot materials;

the first quantum dot light-emitting layer of the second quantum dot light-emitting device includes green quantum dot materials, and the second quantum dot light-emitting layer of the second quantum dot light-emitting device includes blue quantum dot materials;

the first quantum dot light-emitting layer of the third quantum dot light-emitting device includes red quantum dot materials, and the second quantum dot light-emitting layer of the third quantum dot light-emitting device includes blue quantum dot materials.

In one possible implementation, in the above display substrate provided by embodiments of the present disclosure, the first quantum dot light-emitting layer and the second quantum dot light-emitting layer of the first quantum dot light-emitting device includes blue quantum dot materials;

the first quantum dot light-emitting layer of the second quantum dot light-emitting device includes green quantum dot materials, and the second quantum dot light-emitting layer of the second quantum dot light-emitting device includes blue quantum dot materials;

the first quantum dot light-emitting layer of the third quantum dot light-emitting device includes red quantum dot materials, and the second quantum dot light-emitting layer of the third quantum dot light-emitting device includes blue quantum dot materials.

In further another aspect, an embodiment of the present disclosure further provides a driving method of the above quantum dot light-emitting device, including:

applying, under a first working mode, positive and negative voltages of a certain frequency to a first electrode and a second electrode, and controlling a first quantum dot light-emitting layer and a second quantum dot light-emitting layer to emit light alternatively; and applying, under a second working mode, a voltage of a same polarity to the first electrode and the second electrode, applying a voltage of the other polarity to a common electrode, and controlling the first quantum dot light-emitting layer and the second quantum dot light-emitting layer to emit light alternatively.

In one possible implementation, the above driving method provided by embodiments of the present disclosure, further includes:

applying, under a third working mode, the voltage of the same polarity to the first electrode and the second electrode, applying the voltage of the other polarity to the common electrode, and controlling the first quantum dot light-emitting layer and the second quantum dot light-emitting layer to emit light simultaneously.

DETAILED DESCRIPTION OF THE EMBODIMENTS

A structure of a traditional quantum dot light-emitting diode (QLED) device includes a hole injection layer (HI), a hole transport layer (HT), a quantum dot light-emitting layer (QD) and an electron transport layer (ET). Currently, an efficiency of QLED devices has been greatly improved, reaching a mass production level. However, service life of the QLED devices has become a main problem limiting development of the QLED devices. Studies have shown that a major reason for the service life of the QLED devices is aging and failure of the film layers caused by charge accumulation at interface between the film layers. At the same time, due to solution processing characteristics of quantum dots, their processing technology is limited, and display patterning of the QLED devices is mainly realized by an inkjet printing technology. Limited by accuracy of a current inkjet printing technology, it is difficult to increase pixel density of quantum dot display panels, and a pixel resolution is below 200 ppi.

In order to solve the above problem, embodiments of the present disclosure provide a laminated structure of a quantum dot light-emitting device, a corresponding driving method of the quantum dot light-emitting device and a display substrate. In order to make objectives, technical solutions and advantages of the embodiments of the present disclosure clearer, the technical solutions of the embodiments of the present disclosure will be further described below with reference to the accompanying drawings. Obviously, the described embodiments are a part of embodiments of the present disclosure, rather than all the embodiments. Based on the described embodiments of the present disclosure, all other embodiments obtained by those of ordinary skill in the art without creative efforts fall within the protection scope of the present disclosure.

Shapes and dimensions of components in the accompanying drawings do not reflect a real scale, and are only intended to illustrate the present disclosure.

Figure 1:
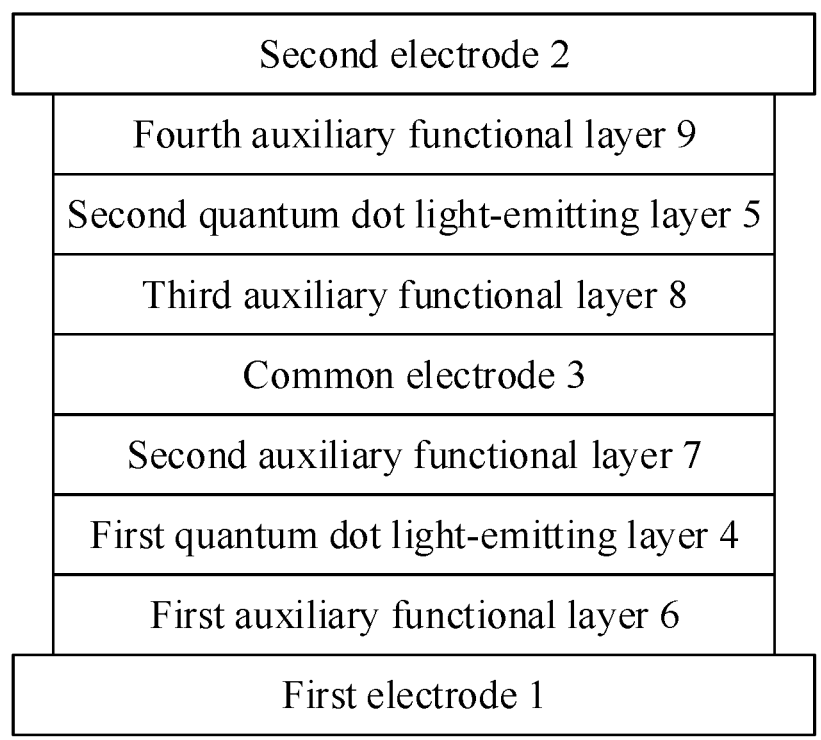
FIG. 1 is a schematic structural diagram of a quantum dot light-emitting device provided by an embodiment of the present disclosure.

A quantum dot light-emitting device provided by an embodiment of the present disclosure, as shown in FIG. 1, includes:

a first electrode 1;

a second electrode 2, arranged opposite to the first electrode 1;

a common electrode 3, located between the first electrode 1 and the second electrode 2;

a first quantum dot light-emitting layer 4, located between the first electrode 1 and the common electrode 3;

a second quantum dot light-emitting layer 5, located between the second electrode 2 and the common electrode 3;

a first auxiliary functional layer 6, located between the first electrode 1 and the first quantum dot light-emitting layer 4;

a second auxiliary functional layer 7, located between the first quantum dot light-emitting layer 4 and the common electrode 3;

a third auxiliary functional layer 8, located between the second quantum dot light-emitting layer 5 and the common electrode 3; and a fourth auxiliary functional layer 9, located between the second electrode 2 and the second quantum dot light-emitting layer 5.

Optionally, in the above quantum dot light-emitting device provided by the embodiment of the present disclosure, the first electrode 1, the first auxiliary functional layer 6, the first quantum dot light-emitting layer 4, the second auxiliary functional layer 5 and the common electrode 3 which are sequentially arranged in a laminated mode constitute one of an upright light-emitting structure and an inverted light-emitting structure, and the common electrode 3, the third auxiliary functional layer 8, the second quantum dot light-emitting layer 5, the fourth auxiliary functional layer 9 and the second electrode 2 which are sequentially arranged in a laminated mode constitute the other one of the upright light-emitting structure and the inverted light-emitting structure.

Optionally, the above quantum dot light-emitting device provided by the embodiment of the present disclosure has a laminated structure, the laminated structure may be simplified into a quantum dot light-emitting device of one upright light-emitting structure and one inverted light-emitting structure, and the upright light-emitting structure and the inverted light-emitting structure are placed in a laminated mode through a layer of a common electrode. In addition, in cooperation with a driving manner of adjusting electrodes, the upright light-emitting structure and the inverted light-emitting structure work alternatively, a carrier recombination region of the laminated structure may be changed, accumulated charges in the quantum dot light-emitting device may be released, the problem of charge accumulation in the quantum dot light-emitting device may be solved, and the service life of the quantum dot light-emitting device may be prolonged.

Optionally, in the quantum dot light-emitting device provided by some embodiments of the present disclosure, the first quantum dot light-emitting layer 4 and the second quantum dot light-emitting layer 5 may include quantum dot materials in a same color. That is, in the laminated structure of the quantum dot light-emitting device, when two identical quantum dot light-emitting layers are used, the service life may be increased by more than two times on an original basis. When a plurality of quantum dot light-emitting devices in different colors serve as pixels to constitute a display substrate, for example, the laminated structure may be used specific to pixels in colors whose service life is shorter during to materials used, so that light-emitting service life of the pixels is improved.

Optionally, in the quantum dot light-emitting device provided by some other embodiments of the present disclosure, the first quantum dot light-emitting layer 4 and the second quantum dot light-emitting layer 5 may include quantum dot materials in different colors. That is, in the laminated structure of the quantum dot light-emitting device, when two identical quantum dot light-emitting layers are used and are applied to pixel arrangement of the display substrate, a pixel density may be effectively improved and therefore a pixel resolution is increased.

Optionally, in the quantum dot light-emitting device provided by some embodiments of the present disclosure, as shown in FIG. 1, in a manufacturing process of the quantum dot light-emitting device, the first electrode 1, the first auxiliary functional layer 6, the first quantum dot light-emitting layer 4, the second auxiliary functional layer 7, the common electrode 3, the third auxiliary functional layer 8, the second quantum dot light-emitting layer 5, the fourth auxiliary functional layer 9 and the second electrode 2 may be sequentially arranged on a base substrate in a laminated mode. The second electrode 2 may be located on a light extraction side of the quantum dot light-emitting device, i.e. it may be considered that the first quantum dot light-emitting layer 4 is located on a lower layer of the second quantum dot light-emitting layer 5. When a light-emitting color of the first quantum dot light-emitting layer 4 is different from a light-emitting color of the second quantum dot light-emitting layer 5, in order to avoid a situation that photoluminescence of the second quantum dot light-emitting layer 5 on an upper layer is caused when the first quantum dot light-emitting layer 4 on the lower layer works, it is needed to design a light-emitting wavelength of the first quantum dot light-emitting layer 4 to be larger than a light-emitting wavelength of the second quantum dot light-emitting layer 5. For example, when the first quantum dot light-emitting layer 4 and the second quantum dot light-emitting layer 5 need to emit blue light and red light respectively, blue quantum dots should be arranged on the second quantum dot light-emitting layer 5 and red quantum dots should be arranged on the first quantum dot light-emitting layer 4, so as to avoid the problem that photoluminescence of the red quantum dots on the upper layer is caused when the blue quantum dots at a bottom layer work.

Figure 2:
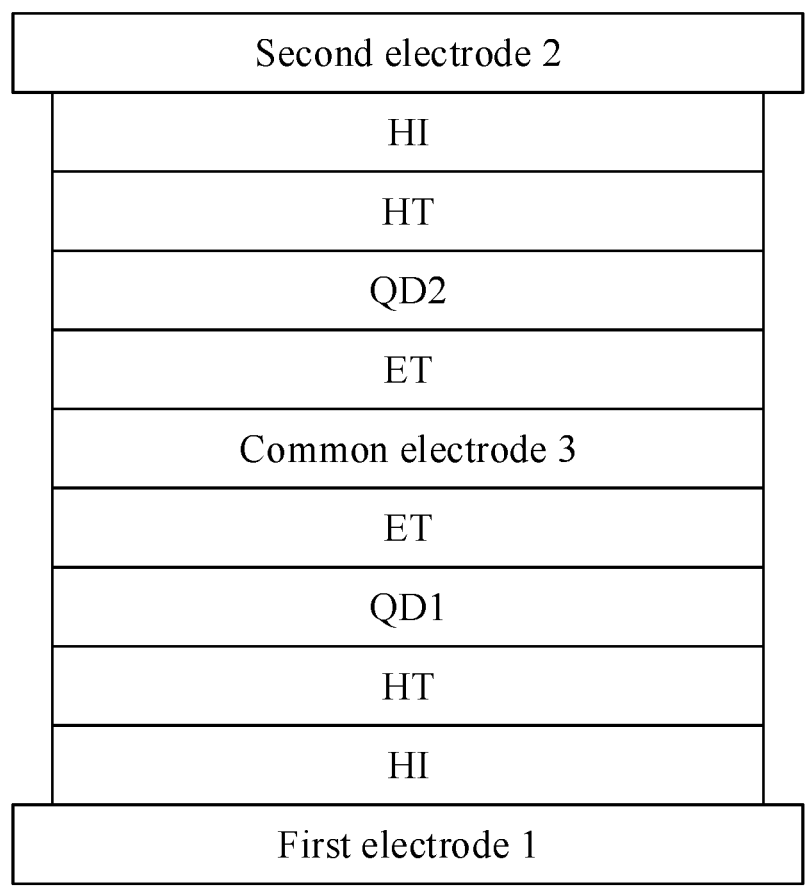
FIG. 2 is a specific schematic structural diagram of a quantum dot light-emitting device provided by an embodiment of the present disclosure.

Optionally, in the quantum dot light-emitting device provided by some embodiments of the present disclosure, the first electrode 1, the first auxiliary functional layer 6, the first quantum dot light-emitting layer 4, the second auxiliary functional layer 7 and the common electrode 3 which are sequentially arranged in a laminated mode may constitute an upright light-emitting structure, and the common electrode 3, the third auxiliary functional layer 8, the second quantum dot light-emitting layer 5, the fourth auxiliary functional layer 9 and the second electrode 2 which are sequentially arranged in a laminated mode may constitute an inverted light-emitting structure. Optionally, as shown in FIG. 2, the second auxiliary functional layer 7 and the third auxiliary functional layer 8 may be both electron transport layers ET. Correspondingly, as shown in FIG. 2, the first auxiliary functional layer 6 may include a hole injection layer HI in direct contact with the first electrode 1 and a hole transport layer HT in direct contact with the first quantum dot light-emitting layer 4; and correspondingly, the fourth auxiliary functional layer 9 may include a hole injection layer HI in direct contact with the second electrode 2 and a hole transport layer HT in direct contact with the second quantum dot light-emitting layer 5.

Figure 3:
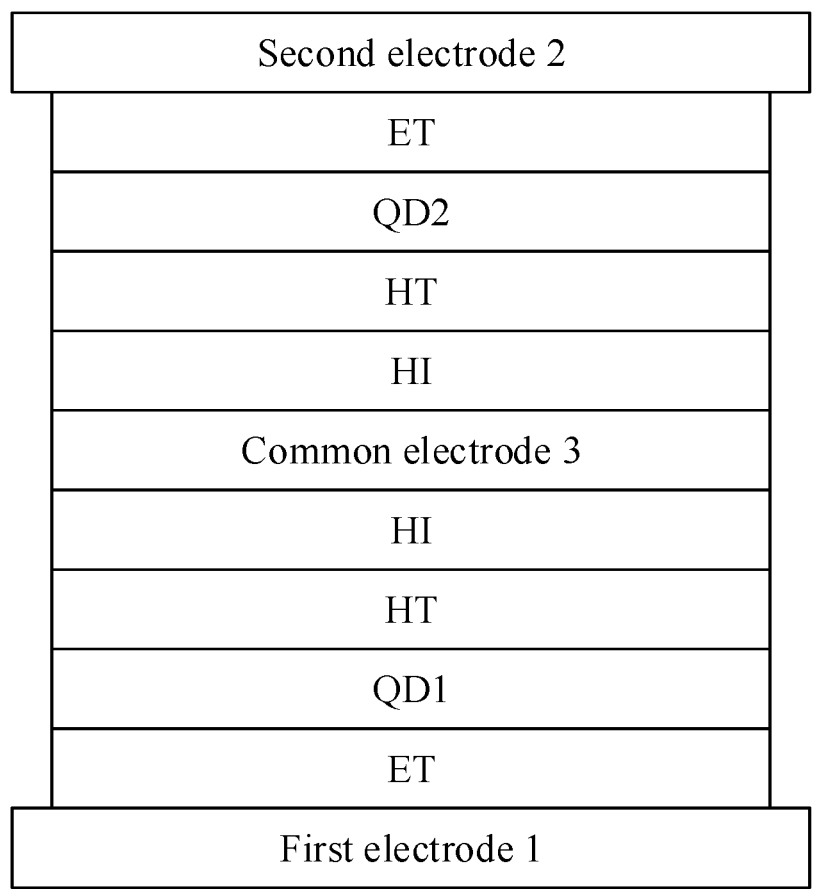
FIG. 3 is another specific schematic structural diagram of a quantum dot light-emitting device provided by an embodiment of the present disclosure.

Optionally, in the quantum dot light-emitting device provided by some embodiments of the present disclosure, the first electrode 1, the first auxiliary functional layer 6, the first quantum dot light-emitting layer 4, the second auxiliary functional layer 7 and the common electrode 3 which are sequentially arranged in a laminated mode may constitute the inverted light-emitting structure, and the common electrode 3, the third auxiliary functional layer 8, the second quantum dot light-emitting layer 5, the fourth auxiliary functional layer 9 and the second electrode 2 which are sequentially arranged in a laminated mode may constitute the upright light-emitting structure. As shown in FIG. 3, the second auxiliary functional layer 7 and the third auxiliary functional layer 8 may each include a hole injection layer HI and a hole transport layer HT, and the hole injection layers HI are located between the common electrode 3 and the hole transport layers HT. Correspondingly, as shown in FIG. 3, the first auxiliary functional layer 6 and the fourth auxiliary functional layer 9 may each include an electron transport layer ET.

Optionally, in the quantum dot light-emitting device provided by some embodiments of the present disclosure, according to energy levels of selected materials of the first quantum dot light-emitting layer and the second quantum dot light-emitting layer, materials of two film layers in the second auxiliary functional layer 7 and the third auxiliary functional layer 8 in direct contact with the common electrode 3 may be the same or different. When the materials of the two film layers in the second auxiliary functional layer 7 and the third auxiliary functional layer 8 in direct contact with the common electrode 3 are different, the common electrode 3 may isolate film layers of different materials, and normal working of the light-emitting structures on two sides is ensured.

Figure 4:
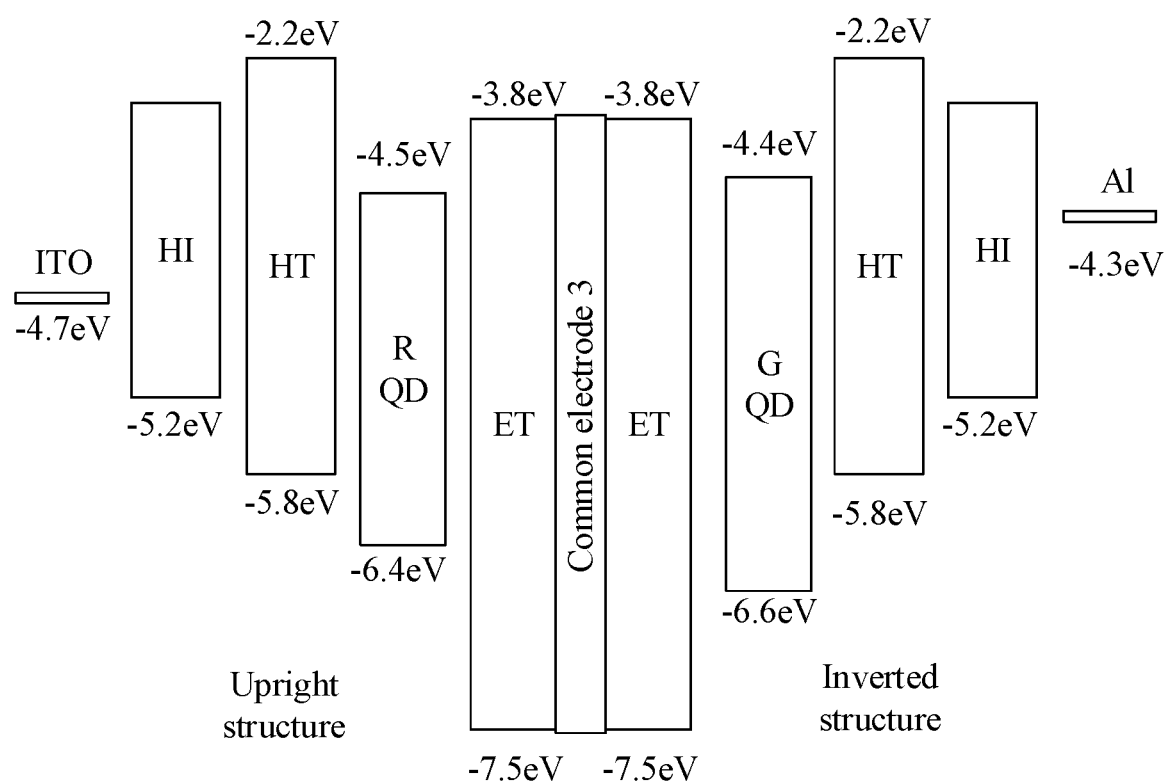
FIG. 4 is a schematic diagram of an energy level of a quantum dot light-emitting device provided by an embodiment of the present disclosure.

Optionally, in a structure as shown in FIG. 2 that the upright light-emitting structure is below the common electrode and the inverted light-emitting structure is above the common electrode, the film layers in the second auxiliary functional layer 7 and the third auxiliary functional layer 8 in direct contact with the common electrode 3 are electron transport layers ET. As shown in FIG. 4, the first quantum dot light-emitting layer 4 is manufactured by adopting a QD1 material, and the second quantum dot light-emitting layer 5 is manufactured by adopting a QD2 material. QD1 may be, for example, a red quantum dot material RQD, and QD2 may be, for example, a green quantum dot material. In a development process of the quantum dot light-emitting device, materials may be selected based on HUMO and LUMO energy levels of the materials, and a potential barrier of injecting carriers into a first (second) quantum dot layer is reduced, so injection of the carriers of the quantum dot light-emitting device is more balanced. When different materials are selected for the electron transport layers ET contained in the second auxiliary functional layer 7 and the third auxiliary functional layer 8, two materials may be selected from zinc oxide, magnesium zinc oxide, and aluminum oxide zinc.

Figure 5:
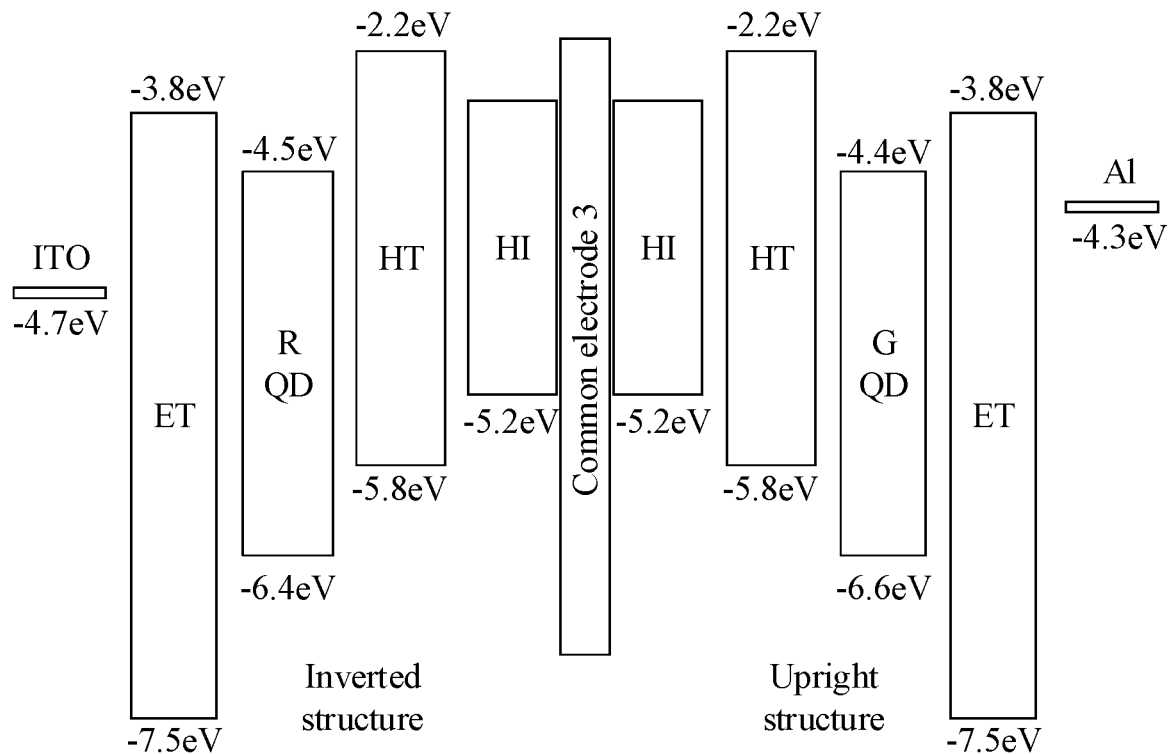
FIG. 5 is a schematic diagram of another energy level of a quantum dot light-emitting device provided by an embodiment of the present disclosure.

Optionally, in a structure as shown in FIG. 3 that the inverted light-emitting structure is below the common electrode and the upright light-emitting structure is above the common electrode, the film layers in the second auxiliary functional layer 7 and the third auxiliary functional layer 8 in direct contact with the common electrode 3 are hole injection layers HI. As shown in FIG. 5, the first quantum dot light-emitting layer 4 is manufactured by adopting the QD1 material, and the second quantum dot light-emitting layer 5 is manufactured by adopting the QD2 material. QD1 may be, for example, the red quantum dot material RQD, and QD2 may be, for example, the green quantum dot material. In the development process of the quantum dot light-emitting device, materials may be selected based on the HUMO and LUMO energy levels of the materials, and the potential barrier of injecting carriers into a first (second) quantum dot layer is reduced, so injection of the carriers of the quantum dot light-emitting device is more balanced.

When different materials are selected for the hole injection layers HI contained in the second auxiliary functional layer 7 and the third auxiliary functional layer 8, adjustment may be performed through doped materials from PEDOT:PSS.

For example, the HUMO energy levels of the red quantum dot material and the green quantum dot material in FIG. 4 and FIG. 5 are respectively −6.4 eV and −6.6 eV. when the material of the hole transport layer HT is selected, a material with larger HUMO energy level than the quantum dot materials should be selected, and meanwhile, an energy level difference between them should be smaller than 1 eV, so a relatively small energy level potential barrier in injecting holes form the HT layers to the QD layers is ensured. Similarly, when the material of the hole injection layer HI is selected, HI (−5.2 eV), HT (−5.8 eV) and QD (−6.4 eV) are selected, a mild energy level potential barrier is achieved in injecting the holes from the HI layer to the QD layer, thereby facilitating injection of the holes. When the material of the hole transport layer ET is selected, a material with relatively large HUMO energy level should be selected, the energy difference from the HUMO energy level of QD is larger than 1 eV, the ET material has a stronger capability of blocking holes, the holes are limited in the QD layer, radiation recombination of the holes and electrons are facilitated, and leakage current is reduced. Meanwhile, the LUMO energy level of the ET should be larger than a LUMO energy level of the QD and an energy level difference between them should be smaller than 1 eV, so a potential barrier in injecting the electrons from the ET to the QD is reduced. The LUMO energy layer of the HT should be larger than the LUMO energy level of the QD and an energy level difference between them should be larger than 1 eV, a relatively strong electron blocking capability is achieved, the electrons are limited in the QD layer, radiation recombination of the electrons and the holes in the QD layer are facilitated, and leakage current is reduced. As shown in FIG. 2, the LUMO energy level of the material of the HT is −2.2 eV, the energy level difference from the LUMO energy level of QD is larger than 2 eV, and a strong electron blocking capability is achieved.

Optionally, in the above quantum dot light-emitting device provided by embodiments of the present disclosure, a material of the common electrode 3 may be selected from but is not limited to electrode materials such as evaporated thin silver, thin aluminum, silver nanoparticles, silver nanorods, ITO, IGZO, etc.

Optionally, the above quantum dot light-emitting device provided by embodiments of the present disclosure is applicable to quantum dot light-emitting materials in any color. These quantum dot light-emitting materials may include but are not limited to: CdS, CdSe, ZnSe, InP, PbS, CsPbCl3, CsPbBr3, CsPhI3, CdS/ZnS, CdSe/ZnS, InP/ZnS, PbS/ZnS, CsPbCl3/ZnS, CsPbBr3/ZnS, CsPhI3/ZnS and other quantum dot materials.

Optionally, taking the structures shown in FIG. 2 and FIG. 4 as examples, a structure made of the following materials may be designed: ITO/PEDOT:PSS/TFB/RQD/ZnO/Ag/ZnO/GQD/TFB/PEDOT:PSS/Al, and a manufacturing process of the device is as follows.

1. Absolute ethanol and deionized water are configured to ultrasonically clean a ITO glass substrate for 15 min each, and then the substrate is dried and is irradiated by an ultraviolet lamp for 10 min, so as to a surface work function of ITO.

2. After the above treatment, the hole injection layer PEDOT:PSS is deposited on the ITO substrate through spin-coating, and surface morphology of the HI is improved through heating to 120° C. and annealing for 15 min.

3. The material TFB of the hole transport layer is spin-coated on a surface of the HI layer, and annealing treatment is performed at 120° C. for 15 min to remove a solvent.

4. A red quantum dot layer is deposited on the TFB film layer through spin-coating, and annealing treatment is performed at 100° C. for 15 min, so a flat RQD layer is formed.

5. An electron transport material ZnO nanoparticles are deposited on a surface of the RQD through spin-coating, and annealing treatment is performed at 100° C. for 15 min.

6. Thin silver of 15-20 nm is evaporated on surfaces of the ZnO nanoparticles.

7. The electron transport material ZnO nanoparticles are deposited on a surface of the thin silver through spin-coating, and annealing treatment is performed at 100° C. for 15 min.

8. Green quantum dots GQD are deposited on the surfaces of the ZnO nanoparticles through spin-coating, and annealing treatment is performed at 100° C. for 15 min.

9. The material TFB of the hole transport layer is spin-coated on a surface of the GQD layer, and annealing treatment is performed at 120° C. for 15 min.

10. The hole injection layer PEDOT:PSS is deposited on the surface of TFB through spin-coating, and annealing treatment is performed at 120° C. for 15 min.

11. An Al electrode is vacuum-evaporated.

12. A glass cover plate is used for packaging, and manufacturing of the device is completed.

Taking the structures shown in FIG. 3 and FIG. 5 as examples, a structure made of the following materials may be designed: ITO/ZnO/RQD/TFB/PEDOT:PSS/Ag/PEDOT:PSS/TFB/GQD/ZnO/Al, and the manufacturing process of the device is as follows.

1. Absolute ethanol and deionized water are configured to ultrasonically clean a ITO glass substrate for 15 min each, and then the substrate is dried and is irradiated by an ultraviolet lamp for 10 min, so as to a surface work function of ITO.

2. After the above treatment, the electron transport material ZnO nanoparticles are deposited on the ITO substrate through spin-coating, and annealing treatment is performed at 100° C. for 15 min.

3. A red quantum dot layer is deposited on the ZnO film layer through spin-coating, and annealing treatment is performed at 100° C. for 15 min, so a flat RQD layer is formed.

4. The material TFB of the hole transport layer is spin-coated on a surface of the RQD layer, and annealing treatment is performed at 120° C. for 15 min to remove a solvent.

5. The hole injection layer PEDOT:PSS is deposited on the surface of TFB, and surface morphology of the HI is improved through heating to 120° C. and annealing for 15 min.

6. Thin silver of 15-20 nm is evaporated on a surface of the HI layer.

7. The hole injection layer PEDOT:PSS is deposited on a surface of the thin silver through spin-coating, and the surface morphology of the HI is improved through heating to 120° C. and annealing for 15 min.

8. The material TFB of the hole transport layer is spin-coated on a surface of the HI layer, and annealing treatment is performed at 120° C. for 15 min to remove a solvent.

9. Green quantum dots GQD are deposited on the TFB film layer, through spin-coating, and annealing treatment is performed at 100° C. for 15 min. a flat GQD layer is formed.

10. The electron transport material ZnO nanoparticles are deposited on the surface of GQD through spin-coating, and annealing treatment is performed at 100° C. for 15 min.

11. An Al electrode is vacuum-evaporated.

12. A glass cover plate is used for packaging, and manufacturing of the device is completed.

Figure 6:
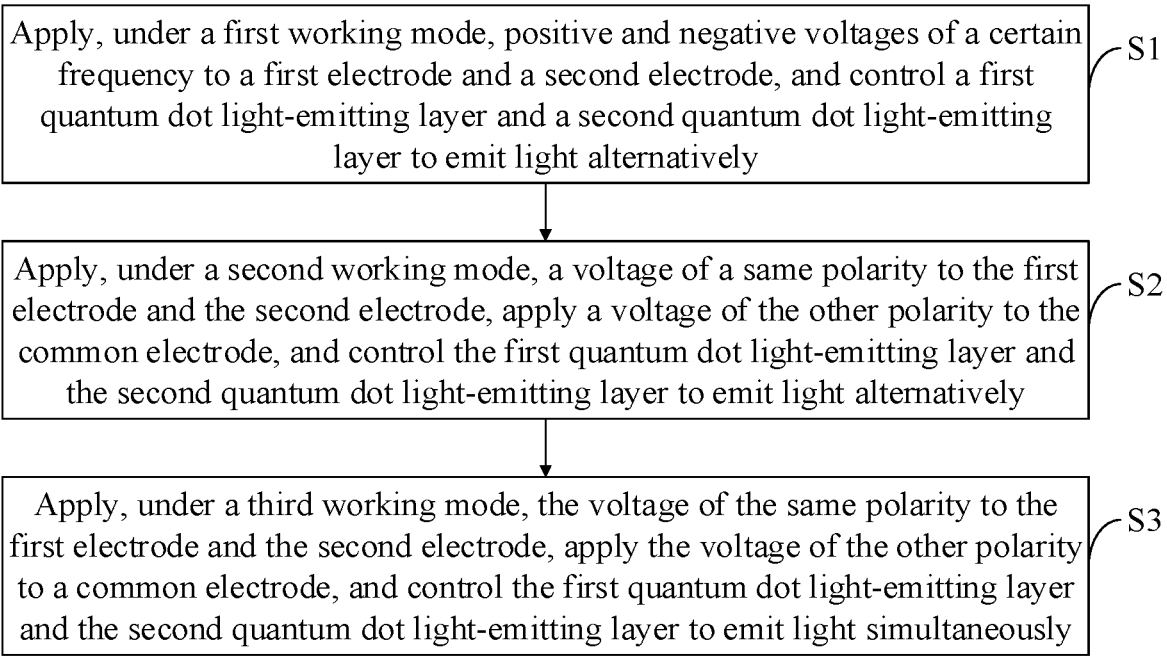
FIG. 6 is a schematic flow diagram of a driving method of a quantum dot light-emitting device provided by an embodiment of the present disclosure.

Based on the same inventive concept, an embodiment of the present disclosure further provides a driving method of the above quantum dot light-emitting device. As shown in FIG. 6, the method may include the following steps.

S1, under a first working mode, positive and negative voltages of a certain frequency are applied to a first electrode and a second electrode, and a first quantum dot light-emitting layer and a second quantum dot light-emitting layer are controlled to emit light alternatively.

Figure 7:
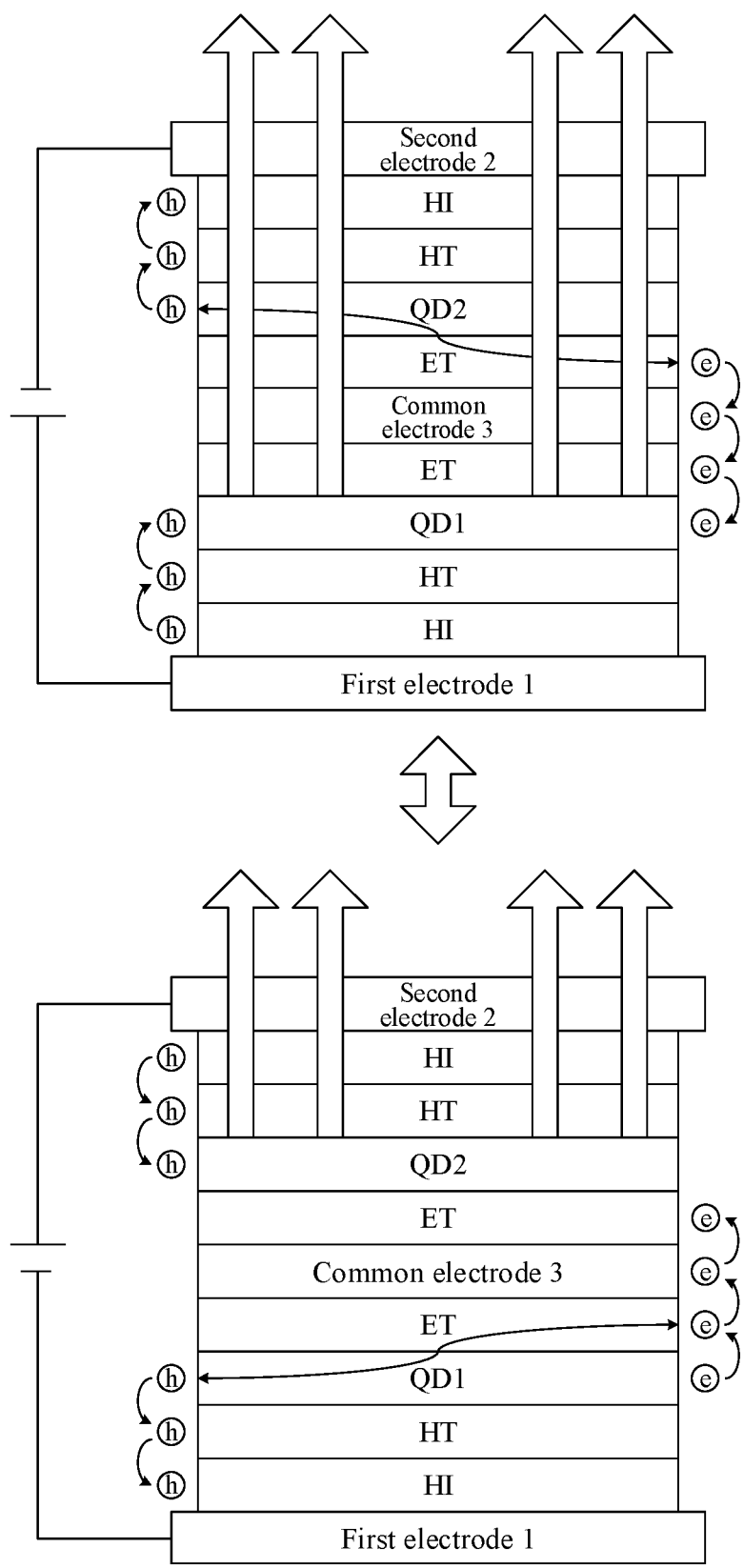
FIG. 7 is a schematic working diagram of a first working mode in a driving method of a quantum dot light-emitting device provided by an embodiment of the present disclosure.
Figure 16:
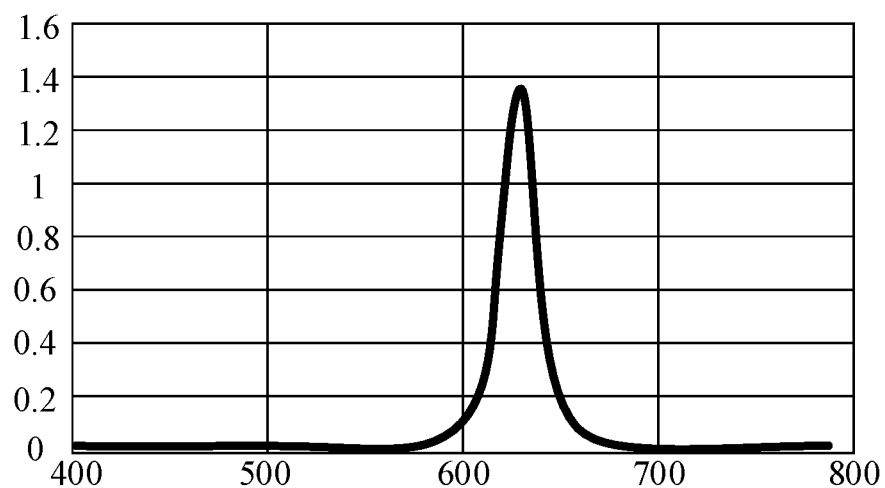
FIG. 16 is a spectrum diagram of light emission of a first quantum dot light-emitting layer in a structure shown in FIG. 2.
Figure 17:
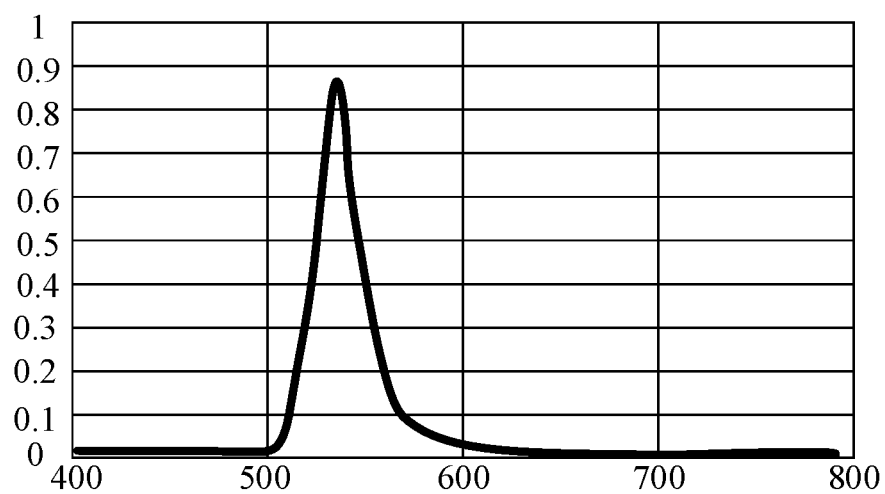
FIG. 17 is a spectrum diagram of light emission of a second quantum dot light-emitting layer in a structure shown in FIG. 2

Taking the structures shown in FIG. 2 and FIG. 4 as examples, according to a working principle diagram shown in FIG. 7, it may be considered on an upper side that a forward voltage is applied (i.e. the positive voltage is applied to the first electrode 1, and the negative voltage is applied to the second electrode 2), red quantum dots QD1 of the first quantum dot light-emitting layer emit light, and a spectrum diagram of light emission is shown in FIG. 16; and it may be considered on a lower side that a reverse voltage is applied (i.e. the negative voltage is applied to the first electrode 1, and the positive voltage is applied to the second electrode 2), green quantum dots QD2 of the second quantum dot light-emitting layer emit light, and a spectrum diagram of light emission is shown in FIG. 17. In FIG. 7, an arrow on a left side is a flow direction of holes, an arrow on a right side is a flow direction of electrons, and hole-electron pairs are separated at a double-sided arrow. A release principle of accumulated charges under the first working mode is: when the red quantum dots work, electrons are majority carriers, the electrons will be accumulated at an interface between ET and QD1, quenching of excitons is caused, and an efficiency of the device is reduced; and meanwhile, accumulation of charges will cause electrochemical reactions of ligands on surfaces of QD1 or ET materials, so service life of the device is shortened. Under the above first working mode, when the first quantum dot light-emitting layer work, a current direction is switched to enable the second quantum dot light-emitting layer to work, and the electrons accumulated at the interface between ET and QD1 will quickly flow to QD2, so the charges are released. Similarly, when the second quantum dot light-emitting layer works, holes are the majority carriers, the holes flow from HI to QD2, and accumulation of the holes at an interface between HT and QD2 will be generated; the current direction is switched to enable the first quantum dot light-emitting layer to work, the flow direction of the holes is changed to flowing from QD2 to HI, and the accumulated holes are released; and the layers work alternatively in a reciprocating mode, so decrease of performance of the device caused by charge accumulation can be effectively reduced.

Figure 8:
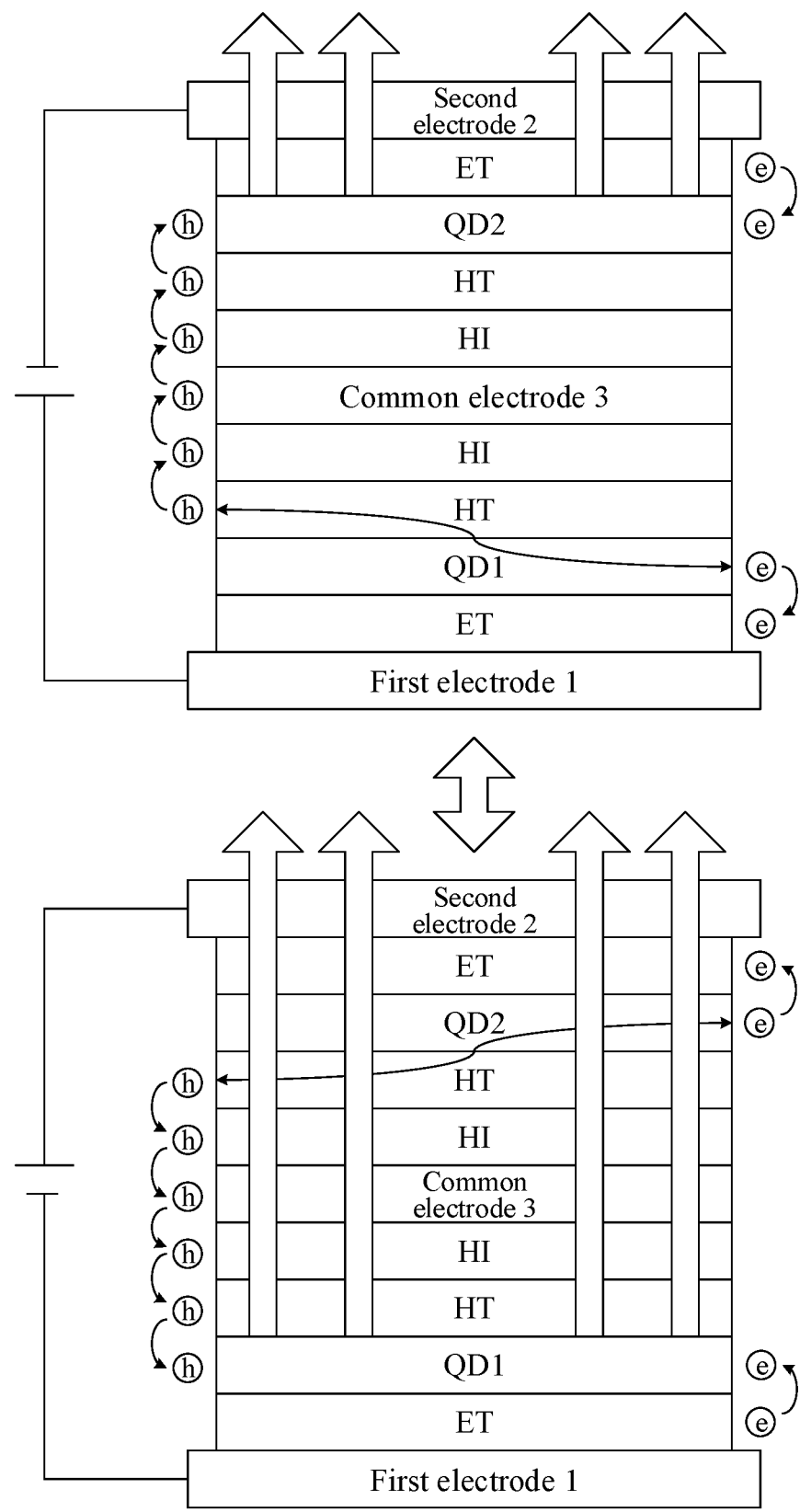
FIG. 8 is another schematic working diagram of a first working mode in a driving method of a quantum dot light-emitting device provided by an embodiment of the present disclosure.

Taking the structures shown in FIG. 3 and FIG. 5 as examples, according to a working principle diagram shown in FIG. 8, it may be considered on the upper side that a forward voltage is applied (i.e. the positive voltage is applied to the first electrode 1, and the negative voltage is applied to the second electrode 2), the green quantum dots QD2 of the second quantum dot light-emitting layer emit light; and it may be considered on the lower side that a reverse voltage is applied (i.e. the negative voltage is applied to the first electrode 1, and the positive voltage is applied to the second electrode 2), the red quantum dots QD1 of the first quantum dot light-emitting layer emit light. In FIG. 8, the arrow on the left side is the flow direction of holes, the arrow on the right side is the flow direction of electrons, and the hole-electron pairs are separated at the double-sided arrow. A release principle of accumulated charges under the first working mode is: when the red quantum dots work, the holes are the majority carriers, the holes will be accumulated at an interface between HT and QD1, quenching of the excitons is caused, and the efficiency of the device is reduced; and meanwhile, accumulation of the charges will cause electrochemical reactions of the ligands on the surfaces of QD1 or ET materials, so service life of the device is shortened. Under the above first working mode, when the first quantum dot light-emitting layer work, the current direction is switched to enable the second quantum dot light-emitting layer to work, and the holes accumulated at the interface between QD1 and HT will quickly flow to QD2, so the holes are released. Similarly, when the second quantum dot light-emitting layer works, the electrons are the majority carriers, the electrons flow from ET to QD2, and accumulation of the holes at an interface between ET and QD2 will be generated; the current direction is switched to enable the first quantum dot light-emitting layer to work, the flow direction of the electrons is changed to flowing from QD2 to HI, and the accumulated holes are released; and the layers work alternatively in a reciprocating mode, so decrease of performance of the device caused by charge accumulation can be effectively reduced.

S2, under a second working mode, a voltage of a same polarity is applied to the first electrode and the second electrode, a voltage of the other polarity is applied to a common electrode, and the first quantum dot light-emitting layer and the second quantum dot light-emitting layer are controlled to emit light alternatively.

Figure 9:
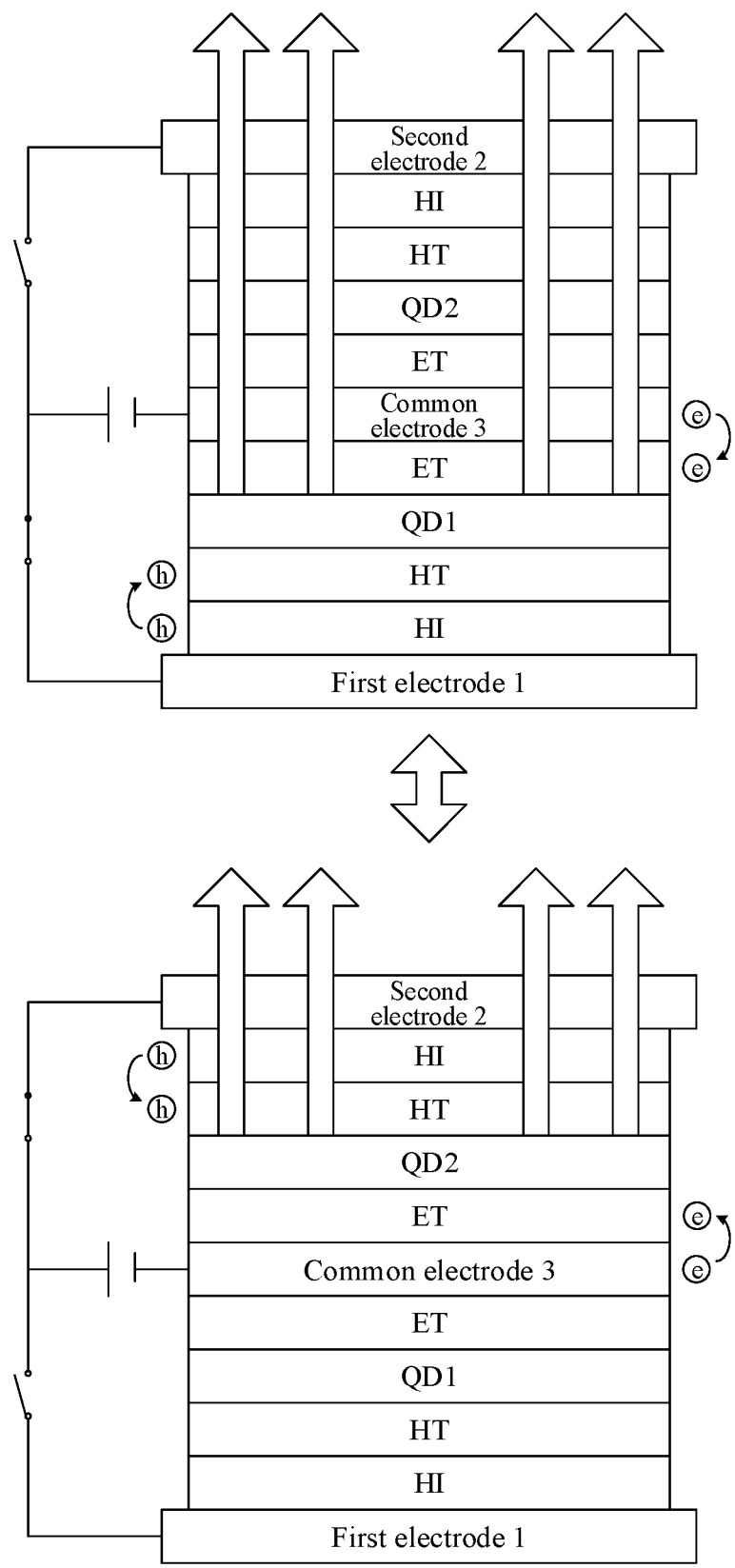
FIG. 9 is a schematic working diagram of a second working mode in a driving method of a quantum dot light-emitting device provided by an embodiment of the present disclosure.

Taking the structures shown in FIG. 2 and FIG. 4 as examples, according to a working principle diagram shown in FIG. 9, it may be considered on the upper side that a lower side circuit is conducted (i.e. the positive voltage is applied to the first electrode 1, and the negative voltage is applied to the common electrode 3), and the red quantum dots QD1 of the first quantum dot light-emitting layer emit light; and it may be considered on a lower side that the lower side circuit is conducted (i.e. the positive voltage is applied to the second electrode 2, and the negative voltage is applied to the common electrode 3), and the green quantum dots QD2 of the second quantum dot light-emitting layer emit light. In FIG. 9, the arrow on the left side is the flow direction of the holes, and the arrow on the right side is the flow direction of the electrons. A release principle of accumulated charges under the second working mode is: when the red quantum dots work, the electrons are the majority carriers, the electrons will be accumulated at the interface between ET and QD1, quenching of the excitons is caused, and the efficiency of the device is reduced; and meanwhile, accumulation of the charges will cause electrochemical reactions of the ligands on the surfaces of the QD1 or ET materials, so service life of the device is shortened. Under the above second working mode, when the first quantum dot light-emitting layer work, the current direction is switched to enable the second quantum dot light-emitting layer to work, and the electrons accumulated at the interface between QD1 and ET will quickly flow to QD2, so the charges are released. Similarly, when the second quantum dot light-emitting layer works, the electrons are the majority carriers, the electrons flow from ET to QD2, and accumulation of the holes at an interface between ET and QD2 will be generated; the current direction is switched to enable the first quantum dot light-emitting layer to work, the flow direction of the electrons is changed to flowing from QD2 to HI, and the accumulated holes are released; and the layers work alternatively in a reciprocating mode, so decrease of performance of the device caused by charge accumulation can be effectively reduced.

Figure 10:
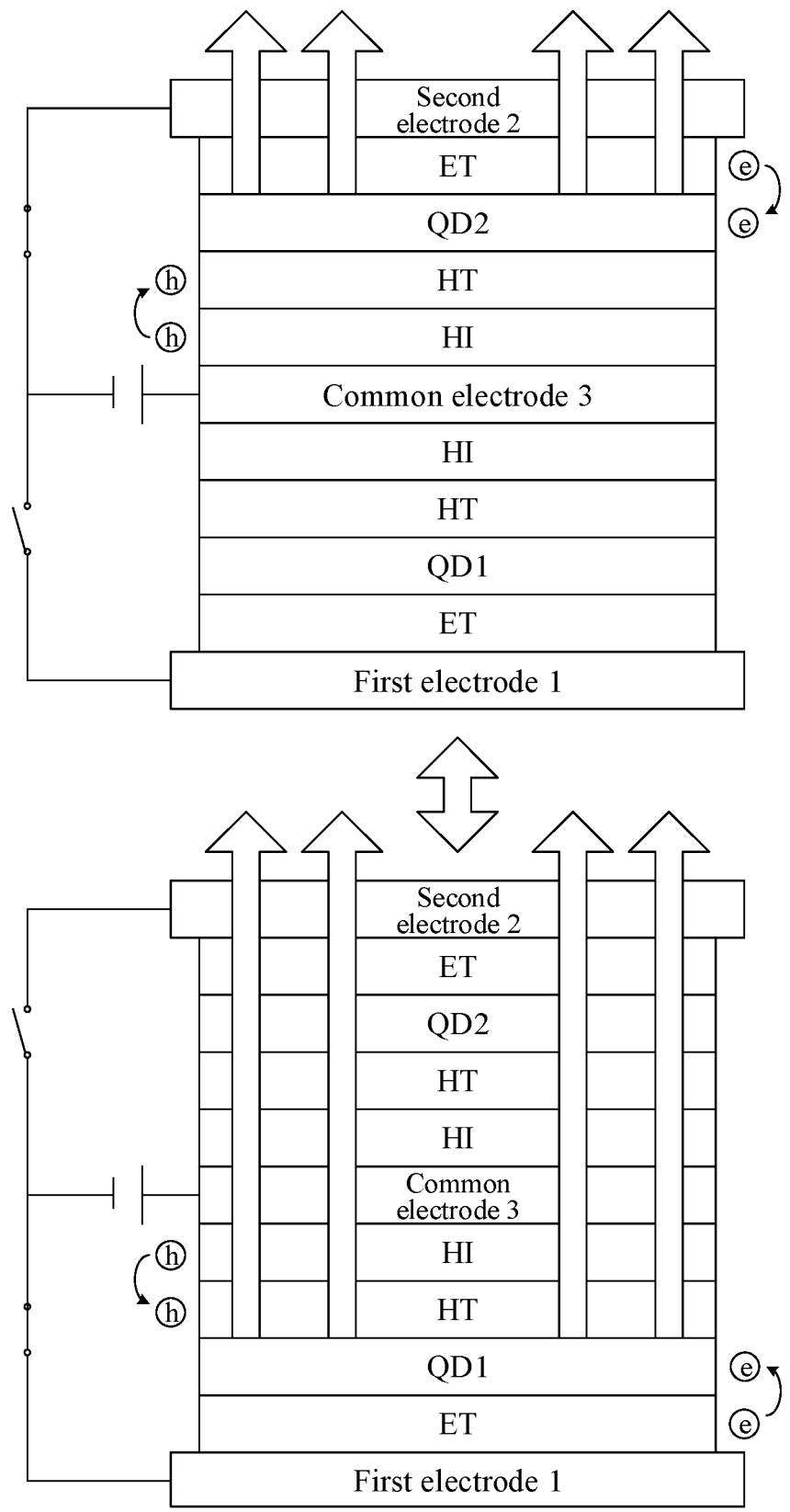
FIG. 10 is another schematic working diagram of a second working mode in a driving method of a quantum dot light-emitting device provided by an embodiment of the present disclosure.

Taking the structures shown in FIG. 3 and FIG. 5 as examples, according to a working principle diagram shown in FIG. 10, it may be considered on the upper side that the upper side circuit is conducted (i.e. the negative voltage is applied to the second electrode 2, and the positive voltage is applied to the common electrode 3), and the green quantum dots QD2 of the second quantum dot light-emitting layer emit light; and it may be considered on the lower side that the lower side circuit is conducted (i.e. the negative voltage is applied to the first electrode 1, and the positive voltage is applied to the common electrode 3), and the red quantum dots QD1 of the first quantum dot light-emitting layer emit light. In FIG. 10, the arrow on the left side is the flow direction of the holes, and the arrow on the right side is the flow direction of the electrons. A release principle of accumulated charges under the second working mode is similar to FIG. 9, and detailed description will not be made here.

It should be noted that, under the second working mode, when the upper side circuit is conducted, loading of any voltage to the first electrode 1 on the lower side may be stopped, i.e. it is set to be floating, or a reverse voltage may be loaded to the first electrode 1 to ensure that the lower side circuit is intercepted. Under the second working mode, when the lower side circuit is conducted, loading of any voltage to the second electrode 2 on the lower side may be stopped, i.e. it is set to be floating, or the reverse voltage may be loaded to the second electrode 2 to ensure that the upper side circuit is intercepted.

Optionally, in the driving method provided by some embodiments of the present disclosure, as shown in FIG. 4, the following steps may further be included.

S3, under a third working mode, the voltage of the same polarity is applied to the first electrode and the second electrode, the voltage of the other polarity is applied to the common electrode, and the first quantum dot light-emitting layer and the second quantum dot light-emitting layer are controlled to emit light simultaneously.

Figure 11:
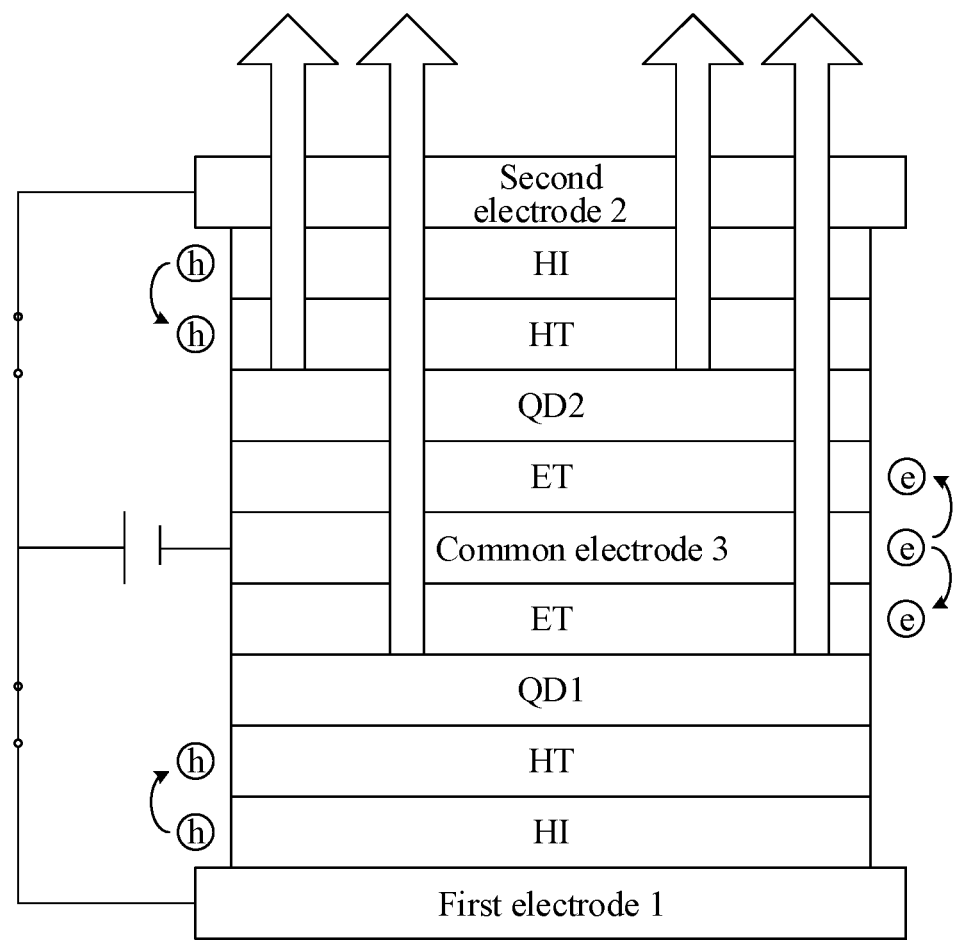
FIG. 11 is a schematic working diagram of a third working mode in a driving method of a quantum dot light-emitting device provided by an embodiment of the present disclosure.
Figure 12:
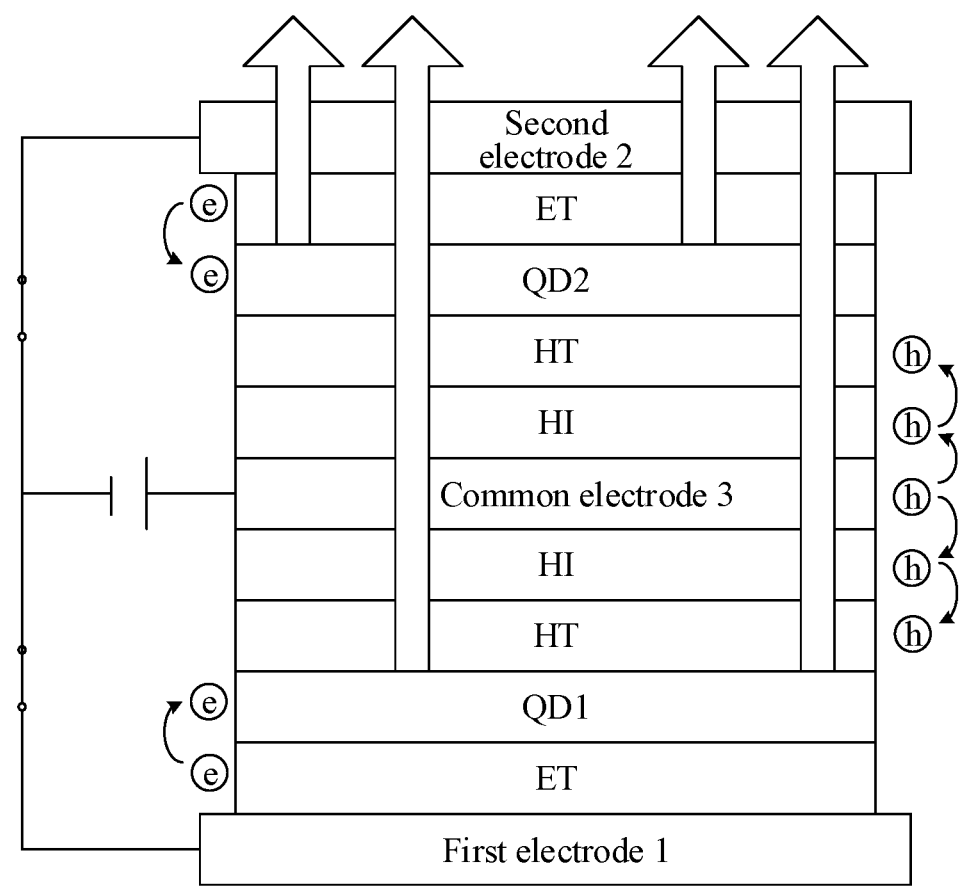
FIG. 12 is another schematic working diagram of a third working mode in a driving method of a quantum dot light-emitting device provided by an embodiment of the present disclosure.

Taking the structures shown in FIG. 2 and FIG. 4 as examples, according to a working principle diagram shown in FIG. 11, the positive voltage is loaded to the first electrode 1 and the second electrode 2 simultaneously, the negative voltage is loaded to the common electrode 3, and the red quantum dots QD1 of the first quantum dot light-emitting layer and the green quantum dots QD2 of the second quantum dot light-emitting layer emit light simultaneously. Taking the structures shown in FIG. 3 and FIG. 5 as examples, according to a working principle diagram shown in FIG. 12, the negative voltage is loaded to the first electrode 1 and the second electrode 2 simultaneously, the positive voltage is loaded to the common electrode 3, and the red quantum dots QD1 of the first quantum dot light-emitting layer and the green quantum dots QD2 of the second quantum dot light-emitting layer emit light simultaneously. When the upper side and lower side circuits are conducted simultaneously, an upright quantum dot light-emitting device and an inverted work simultaneously, an entire quantum dot light-emitting device can emit different composite light according to light-emitting colors and intensities of the two quantum dot light-emitting layers, which can be applied to a pixel design of a display substrate to improve chromaticity of the substrate, so a display screen is finer.

Figure 13:
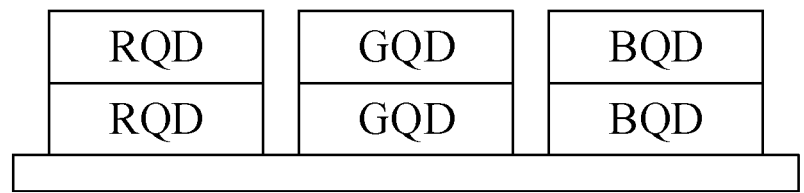
FIG. 13 is a schematic structural diagram of a display substrate provided by an embodiment of the present disclosure.
Figure 14:
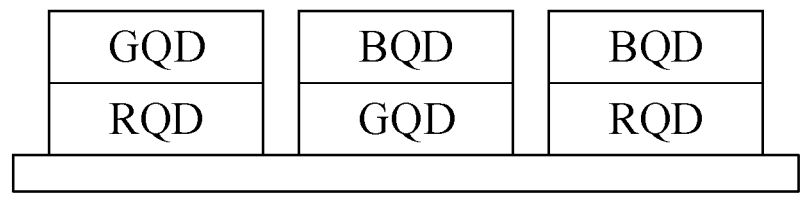
FIG. 14 is another schematic structural diagram of a display substrate provided by an embodiment of the present disclosure.
Figure 15:
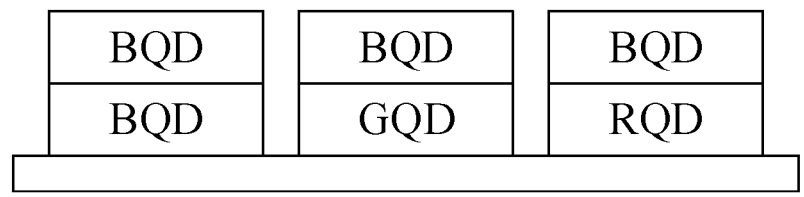
FIG. 15 is further another schematic structural diagram of a display substrate provided by an embodiment of the present disclosure.

Based on the same inventive concept, an embodiment of the present disclosure provides a display substrate, as shown in FIG. 13 to FIG. 15, including: a plurality of the above quantum dot light-emitting devices provided by the embodiment of the present disclosure.

Optionally, in the display substrate provided by some embodiments of the present disclosure, as shown in FIG. 13, a first quantum dot light-emitting layer and a second quantum dot light-emitting layer of each quantum dot light-emitting device include quantum dot materials in a same color. When the first quantum dot light-emitting layer and the second quantum dot light-emitting layer of each quantum dot light-emitting device include the quantum dot materials in the same color, in combination with the above driving method, the first quantum dot light-emitting layer and the second quantum dot light-emitting layer work alternatively, and service life of the display substrate may be greatly improved.

In the display substrate provided by some embodiments of the present disclosure, as shown in FIG. 13, the display substrate has a plurality of pixels, and each pixel includes a first quantum dot light-emitting device, a second quantum dot light-emitting device and a third quantum dot light-emitting device which are arranged adjacent to one another.

The first quantum dot light-emitting layer and the second quantum dot light-emitting layer of each first quantum dot light-emitting device include red quantum dot materials RQD.

The first quantum dot light-emitting layer and the second quantum dot light-emitting layer of each second quantum dot light-emitting device include green quantum dot materials GQD.

The first quantum dot light-emitting layer and the second quantum dot light-emitting layer of each third quantum dot light-emitting device include blue quantum dot materials BQD.

Optionally, in the display substrate provided by some embodiments of the present disclosure, as shown in FIG. 14 and FIG. 15, the display substrate has a plurality of pixels, each pixel includes a first quantum dot light-emitting device, a second quantum dot light-emitting device and a third quantum dot light-emitting device which are arranged adjacent to one another, and a first quantum dot light-emitting layer and a second quantum dot light-emitting layer of at least one of the first quantum dot light-emitting device, the second quantum dot light-emitting device or the third quantum dot light-emitting device include quantum dot materials of different colors.

In each second quantum dot light-emitting device and each third quantum dot light-emitting device adjacent to each other, as shown in FIG. 14 and FIG. 15, the two corresponding first quantum dot light-emitting layers and the two corresponding second quantum dot light-emitting layers include quantum dot materials in three different colors in total, so needs of pixel display may be satisfied.

Optionally, when the first quantum dot light-emitting layer and the second quantum dot light-emitting layer of each quantum dot light-emitting device include the quantum dot materials in different colors, in combination with the above driving method, the first quantum dot light-emitting layers and the second quantum dot light-emitting layers work alternatively, so a pixel density of the display substrate may be improved.

Optionally, in the display substrate provided by some embodiments of the present disclosure, as shown in FIG. 14, in every two adjacent quantum dot light-emitting devices, the two first quantum dot light-emitting layers and the two second quantum dot light-emitting layers include the quantum dot materials in three different colors in total. In this way, every three adjacent quantum dot light-emitting devices have two sets of quantum dot materials in three different colors, which may constitute two virtual pixels, and a resolution of the display pixels twice a resolution of physical pixels is realized.

Optionally, in the display substrate provided by some embodiments of the present disclosure, as shown in FIG. 14, three adjacent quantum dot light-emitting devices may constitute one pixel (i.e. physical pixel), and each pixel includes a first quantum dot light-emitting device, a second quantum dot light-emitting device and a third quantum dot light-emitting device.

The first quantum dot light-emitting layers of the first quantum dot light-emitting devices include red quantum dot materials RQD, and the second quantum dot light-emitting layers of the first quantum dot light-emitting devices include green quantum dot materials GQD.

The first quantum dot light-emitting layers of the second quantum dot light-emitting devices include green quantum dot materials GQD, and the second quantum dot light-emitting layers of the second quantum dot light-emitting devices include blue quantum dot materials BQD.

The first quantum dot light-emitting layers of the third quantum dot light-emitting devices include red quantum dot materials RQD, and the second quantum dot light-emitting layers of the third quantum dot light-emitting devices include blue quantum dot materials BQD.

Optionally, in the display substrate provided by some embodiments of the present disclosure, as shown in FIG. 15, the first quantum dot light-emitting layers and the second quantum dot light-emitting layers of a part of quantum dot light-emitting devices include quantum dot materials in different colors, and the first quantum dot light-emitting layers and the second quantum dot light-emitting layers of the other part of quantum dot light-emitting devices include quantum dot materials in the same color. Optionally, for quantum dot materials with relatively short light-emitting service life, the first quantum dot light-emitting layers and the second quantum dot light-emitting layers may include quantum dot materials in the same color, for example, the blue quantum dot materials BQD. Specifically, the first quantum dot light-emitting layers and the second quantum dot light-emitting layers of the first quantum dot light-emitting devices may include blue quantum dot materials; The first quantum dot light-emitting layers of the second quantum dot light-emitting devices may include green quantum dot materials, and the second quantum dot light-emitting layers of the second quantum dot light-emitting devices may include blue quantum dot materials; and the first quantum dot light-emitting layers of the third quantum dot light-emitting devices may include red quantum dot materials, and the second quantum dot light-emitting layers of the third quantum dot light-emitting devices may include blue quantum dot materials.

Optionally, in the display substrate provided by some embodiments of the present disclosure, the display substrate may be a regular display product, and may specifically be: a mobile phone, a tablet computer, a TV, a monitor, a notebook computer, a digital photo frame, and a navigator, or any other product or component with a display function.

Obviously, those of skill in the art can make various changes and modifications to the present disclosure without departing from the spirit and scope of the present disclosure. Thus, provided that these changes and modifications of the present disclosure fall within the scope of the claims of the present disclosure and their equivalents, the present disclosure is also intended to cover such modifications and variations.

What is claimed is:

1. A quantum dot light-emitting device, comprising:
a first electrode;
a second electrode, arranged opposite to the first electrode;
a common electrode, located between the first electrode and the second electrode;
a first quantum dot light-emitting layer, located between the first electrode and the common electrode;
a second quantum dot light-emitting layer, located between the second electrode and the common electrode;
a first auxiliary functional layer, located between the first electrode and the first quantum dot light-emitting layer;
a second auxiliary functional layer, located between the first quantum dot light-emitting layer and the common electrode;
a third auxiliary functional layer, located between the second quantum dot light-emitting layer and the common electrode; and
a fourth auxiliary functional layer, located between the second electrode and the second quantum dot light-emitting layer;
wherein the second auxiliary functional layer and the third auxiliary functional layer are both electron transport layers, or the second auxiliary functional layer and the third auxiliary functional layer each comprises a hole injection layer and a hole transport layer, and the hole injection layers are located between the common electrode and the hole transport layers.

2. The quantum dot light-emitting device according to claim 1, wherein the first electrode, the first auxiliary functional layer, the first quantum dot light-emitting layer, the second auxiliary functional layer and the common electrode which are sequentially arranged in a laminated mode form one of an upright light-emitting structure and an inverted light-emitting structure, and the common electrode, the third auxiliary functional layer, the second quantum dot light-emitting layer, the fourth auxiliary functional layer and the second electrode which are sequentially arranged in a laminated mode form other one of the upright light-emitting structure and the inverted light-emitting structure.

3. The quantum dot light-emitting device according to claim 1, wherein the first quantum dot light-emitting layer and the second quantum dot light-emitting layer comprise quantum dot materials in a same color.

4. The quantum dot light-emitting device according to claim 1, wherein the first quantum dot light-emitting layer and the second quantum dot light-emitting layer comprise quantum dot materials in different colors.

5. The quantum dot light-emitting device according to claim 4, wherein the second electrode is located on a light extraction side of the quantum dot light-emitting device, and a light-emitting wavelength of the first quantum dot light-emitting layer is larger than a light-emitting wavelength of the second quantum dot light-emitting layer.

6. The quantum dot light-emitting device according to claim 1, wherein materials of two film layers in the second auxiliary functional layer and the third auxiliary functional layer in direct contact with the common electrode are different.

7. The quantum dot light-emitting device according to claim 1, wherein the first auxiliary functional layer comprises a hole injection layer in direct contact with the first electrode and a hole transport layer in direct contact with the first quantum dot light-emitting layer, wherein the fourth auxiliary functional layer comprises a hole injection layer in direct contact with the second electrode and a hole transport layer in direct contact with the second quantum dot light-emitting layer.

8. The quantum dot light-emitting device according to claim 1, wherein the first auxiliary functional layer and the fourth auxiliary functional layer comprise an electron transport layer.

9. A display substrate, comprising: a plurality of the quantum dot light-emitting devices according to claim 1.

10. The display substrate according to claim 9, wherein a first quantum dot light-emitting layer and a second quantum dot light-emitting layer of each quantum dot light-emitting device comprise quantum dot materials in a same color.

11. The display substrate according to claim 10, wherein the display substrate has a plurality of pixels, and each pixel comprises a first quantum dot light-emitting device, a second quantum dot light-emitting device and a third quantum dot light-emitting device which are arranged adjacent to one another, wherein the first quantum dot light-emitting layer and the second quantum dot light-emitting layer of each first quantum dot light-emitting device comprise red quantum dot materials;

the first quantum dot light-emitting layer and the second quantum dot light-emitting layer of each second quantum dot light-emitting device comprise green quantum dot materials; and the first quantum dot light-emitting layer and the second quantum dot light-emitting layer of each third quantum dot light-emitting device comprise blue quantum dot materials.

12. The display substrate according to claim 9, wherein the display substrate has a plurality of pixels, each of the pixels comprises a first quantum dot light-emitting device, a second quantum dot light-emitting device and a third quantum dot light-emitting device which are arranged adjacent to one another, and a first quantum dot light-emitting layer and a second quantum dot light-emitting layer of at least one of the first quantum dot light-emitting device, the second quantum dot light-emitting device or the third quantum dot light-emitting device comprise quantum dot materials of different colors.

13. The display substrate according to claim 12, wherein in each second quantum dot light-emitting device and each third quantum dot light-emitting device adjacent to each other, the two corresponding first quantum dot light-emitting layers and the two corresponding second quantum dot light-emitting layers comprise quantum dot materials in three different colors in total.

14. The display substrate according to claim 13, wherein the first quantum dot light-emitting layer of the first quantum dot light-emitting device comprises red quantum dot materials, and the second quantum dot light-emitting layer of the first quantum dot light-emitting device comprises green quantum dot materials;

the first quantum dot light-emitting layer of the second quantum dot light-emitting device comprises green quantum dot materials, and the second quantum dot light-emitting layer of the second quantum dot light-emitting device comprises blue quantum dot materials; and the first quantum dot light-emitting layer of the third quantum dot light-emitting device comprises red quantum dot materials, and the second quantum dot light-emitting layer of the third quantum dot light-emitting device comprises blue quantum dot materials.

15. The display substrate according to claim 13, wherein the first quantum dot light-emitting layer and the second quantum dot light-emitting layer of the first quantum dot light-emitting device comprise blue quantum dot materials;

the first quantum dot light-emitting layer of the second quantum dot light-emitting device comprises green quantum dot materials, and the second quantum dot light-emitting layer of the second quantum dot light-emitting device comprises blue quantum dot materials; and the first quantum dot light-emitting layer of the third quantum dot light-emitting device comprises red quantum dot materials, and the second quantum dot light-emitting layer of the third quantum dot light-emitting device comprises blue quantum dot materials.

16. A driving method of the quantum dot light-emitting device according to claim 1, comprising:

applying, under a first working mode, positive and negative voltages of a certain frequency to the first electrode and the second electrode, and controlling the first quantum dot light-emitting layer and the second quantum dot light-emitting layer to emit light alternatively; and applying, under a second working mode, a voltage of a same polarity to the first electrode and the second electrode, applying a voltage of other polarity to the common electrode, and controlling the first quantum dot light-emitting layer and the second quantum dot light-emitting layer to emit light alternatively.

17. The driving method according to claim 16, further comprising:

applying, under a third working mode, the voltage of the same polarity to the first electrode and the second electrode, applying the voltage of other polarity to the common electrode, and controlling the first quantum dot light-emitting layer and the second quantum dot light-emitting layer to emit light simultaneously.

\* \* \* \* \*